US 12,453,081 B2

(12) United States Patent
Fang et al.

(10) Patent No.: US 12,453,081 B2
(45) Date of Patent: Oct. 21, 2025

(54) METHOD OF FORMING A BIT LINE STRUCTURE

(71) Applicant: ChangXin Memory Technologies, Inc., Hefei (CN)

(72) Inventors: Jia Fang, Hefei (CN); Zhongming Liu, Hefei (CN); Yexiao Yu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 378 days.

(21) Appl. No.: 17/915,991

(22) PCT Filed: Sep. 7, 2021

(86) PCT No.: PCT/CN2021/116908
§ 371 (c)(1),
(2) Date: Sep. 29, 2022

(87) PCT Pub. No.: WO2023/015639
PCT Pub. Date: Feb. 16, 2023

(65) Prior Publication Data
US 2024/0098982 A1    Mar. 21, 2024

(30) Foreign Application Priority Data
Aug. 12, 2021   (CN) .......................... 202110923884.8

(51) Int. Cl.
H10B 12/00    (2023.01)

(52) U.S. Cl.
CPC ........... H10B 12/482 (2023.02); H10B 12/03 (2023.02); H10B 12/485 (2023.02)

(58) Field of Classification Search
CPC ... H10B 12/315; H10B 12/482; H10B 12/485
(Continued)

(56) References Cited

U.S. PATENT DOCUMENTS 6,303,424 B1    10/2001  Lee et al.
9,082,755 B2 *   7/2015  Kim ..................... H10B 12/485
(Continued)

FOREIGN PATENT DOCUMENTS

CN    109065501 A    12/2018
CN    109979940 A     7/2019
(Continued)

OTHER PUBLICATIONS

PCT/CN2021/116908 International Search Report and Written Opinion mailed May 11, 2022.
(Continued)

*Primary Examiner* — Hoai V Pham
(74) *Attorney, Agent, or Firm* — Kilpatrick Townsend & Stockton LLP

(57) ABSTRACT

The present application discloses a semiconductor structure and a method for fabrication. This technique improves the stability of the bit line structure. The semiconductor structure is formed in a bit line trench in a substrate, it includes: a bit line conductive layer formed in the bit line trench, and the top surface of the bit line conductive layer is higher the top surface of the substrate; a barrier layer formed at least partially between the bit line conductive layer and the inner wall of the bit line trench; and an isolation layer formed on top of the bit line conductive layer.

8 Claims, 16 Drawing Sheets

(58) Field of Classification Search
USPC .......................................................... 438/262
See application file for complete search history.

(56) References Cited

U.S. PATENT DOCUMENTS

2005/0173750 A1    8/2005   Park
2010/0164114 A1    7/2010   Kang et al.

FOREIGN PATENT DOCUMENTS

| CN | 111048467 A | 4/2020 |
| CN | 112951769 A | 6/2021 |
| CN | 113035872 A | 6/2021 |
| CN | 113097146 A | 7/2021 |

OTHER PUBLICATIONS

CN 202110923884.8 Office Action mailed Jun. 25, 2023, English translation not available.

* cited by examiner

METHOD OF FORMING A BIT LINE STRUCTURE

CROSS REFERENCES TO RELATED APPLICATIONS

This application claims the benefit of priority of Chinese patent application with the application number of 202110923884.8 and the application title of "A Semiconductor Structure And Method of Forming The Same", which was submitted to the Chinese Patent Office on Aug. 12, 2021 the contents of which are incorporated herein by reference in its entirety.

TECHNICAL FIELD

The present application relates to the field of semiconductor technology, and in particular, to a semiconductor structure and a method for forming the same.

BACKGROUND

An existing dynamic random access memory (DRAM) device includes a large number of storage units, each contains a capacitor and a transistor, used to store one byte of information.

The development of dynamic memory emphasizes high speed, high integration density, and low power consumption. With the shrinking of the structure size of semiconductor devices, especially in the manufacturing process of DRAMs with critical dimensions less than 20 nm, the structural stability of the bit lines directly determines quality of the DRAM electrical properties.

In addition, shrinking of critical dimensions in the manufacturing process of DRAM has led to more demanding requirements for the size and stability of bit lines, so the stability of the bit lines has become an urgent problem to be solved.

SUMMARY

According to an embodiment of the present application, a semiconductor structure in a bit line trench on a substrate, includes:
- a bit line conductive layer disposed in the bit line trench, and the top surface of the bit line conductive layer is higher than the top surface of the substrate;
- a barrier layer, at least partially disposed between the bit line conductive layer and the inner wall of the bit line trench; and
- an isolation layer disposed on the top of the bit line conductive layer.

According to another embodiment of the present application, a method for forming a semiconductor structure includes:
- providing a substrate having a first region and a second region, the substrate is provided with a first insulating layer and a first isolation layer in sequence, and a first trench is formed in the first region;
- filling the first trench;
- removing the first isolation layer of the second region; and
- forming a second trench at the first trench.

BRIEF DESCRIPTION OF THE DRAWINGS

In order to illustrate the technical solutions in the embodiments of the present application more clearly, the following briefly introduces the accompanying drawings used in the description of the embodiments. Obviously, the drawings in the following description are only some embodiments of the present application. For those of ordinary skill in the art, other drawings can also be obtained from these drawings without any creative effort.

Figure 1A:
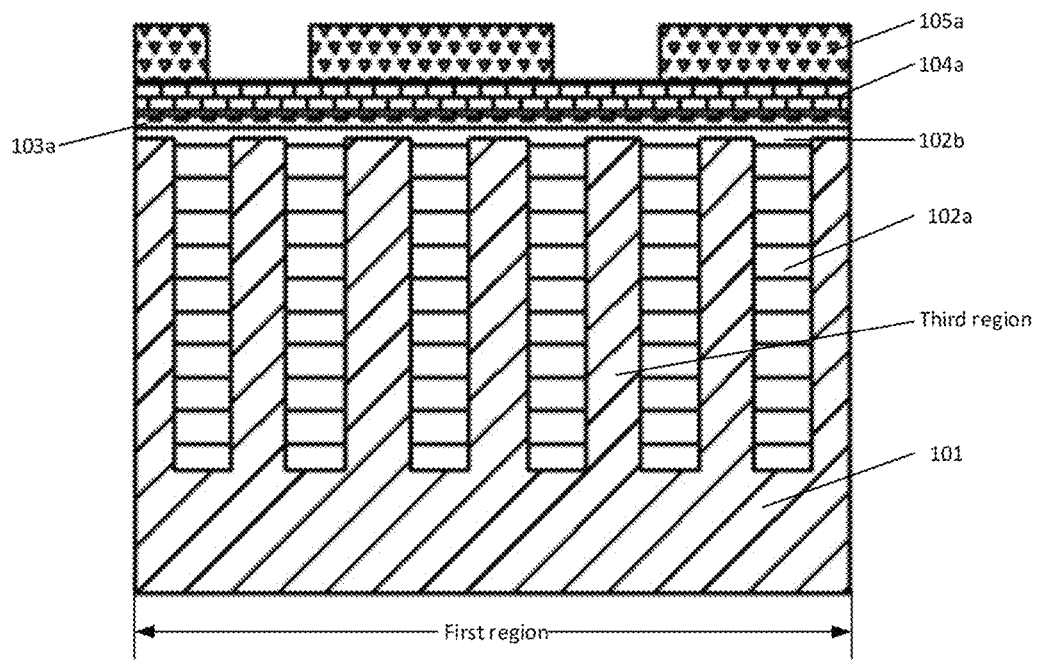
FIG. 1a and FIG. 1b are respectively the cross-sectional views of the first region and the second region of a structure obtained after the photoresist in the array area is exposed to form a desired pattern in the fabrication process according to the embodiment of the present application.

DESCRIPTION OF REFERENCE NUMBERS 101 substrate
102a first insulating layer
102b second insulating layer
102c third insulating layer
103a first isolation layer
104a second isolation layer
103b third isolation layer
104b fourth isolation layer
104c fifth isolation layer
103c sixth isolation layer
105a first photoresist
105b second photoresist
105c third photoresist
105d third photoresist
106a first polysilicon layer (i.e., first contact layer)
106b second polysilicon layer
106c third polysilicon layer (i.e., second contact layer)
107 barrier
108 bit line conductive layer
109 amorphous carbon layer
110 Spin On Hardmask (SOH) layer
111 node contact hole
112a first trench
112b second trench (i.e. bit line trench)

DETAILED DESCRIPTION OF THE PREFERRED EMBODIMENTS

The technical solutions in the embodiments of the present application will be clearly and completely described below with reference to the drawings in the embodiments of the present application. Obviously, the described embodiments are only a part of the embodiments of the present application, not all of the embodiments. Based on the embodiments in the present application, all other embodiments obtained by those of ordinary skill in the art without creative efforts shall fall within the protection scope of the present application.

The embodiment of the present application proposes a simple, effective and practical bit line manufacturing process for the problem of the collapse of the bit line structure, which is applied to the manufacture of the DRAM structure.

The embodiment of the present application utilizes the mask segmentation process in the array area and the peripheral circuit area, which reduces the process steps and eliminates the technical problem of the unevenness of the polysilicon height of the bit line contact hole. The process makes smaller inside area, thereby reducing the height of the bit line, reducing the risk of bit line collapse, and reducing the risk of voids in the node contact holes, that is, the depth of the node contact holes and the height of the bit lines are consistent, and reduction of the height of the bit line will reduce the node contact hole and contact hole depth, which facilitates subsequent polysilicon filling.

Figure 1B:
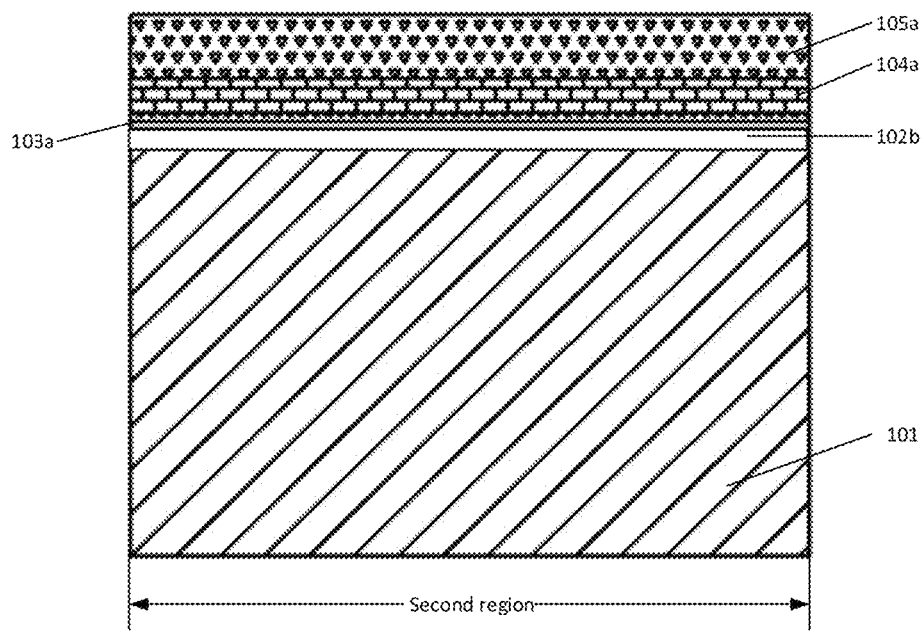
Figure 2A:
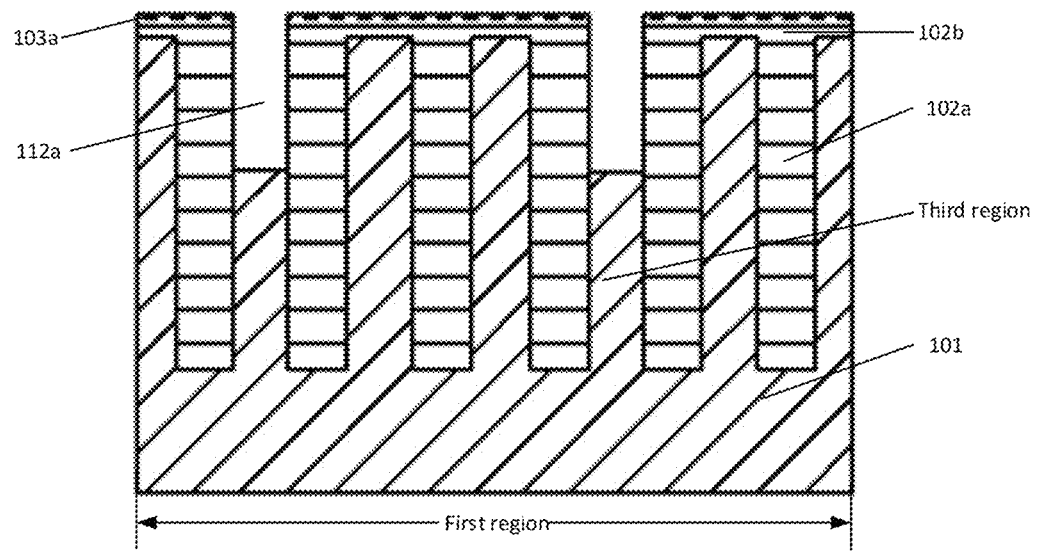
FIG. 2a and FIG. 2b are respectively the cross-sectional views of the first region and the second region of a structure obtained after forming a bit line contact hole in the fabrication process according to the embodiment of the present application.
Figure 2B:
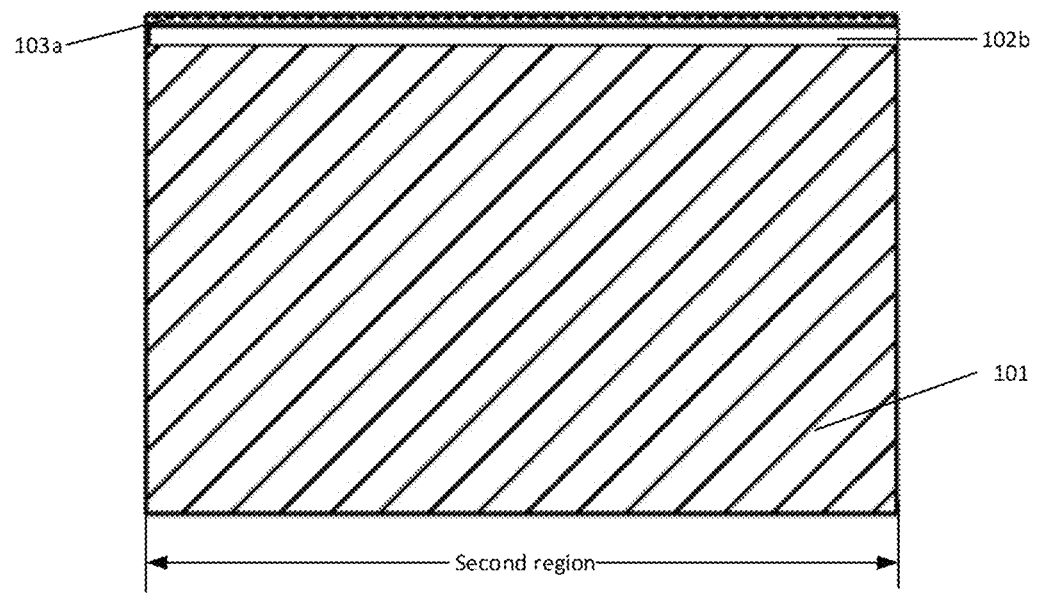

The semiconductor structure fabrication process flow provided by the embodiments of the present application includes:

Step 1, cover the photoresist 105a in the array area (i.e., the first region) and the peripheral circuit area (i.e., the second region), and the first photoresist 105a in the array area is exposed to form a desired pattern, as shown in FIG. 1a and FIG. 1b, and the pattern shown in FIG. 2a and FIG. 2b, which include the substrate 101, the first insulating layer 102a and the second insulating layer 102b, the first isolation layer 103a and the second isolation layer 104a, herein: The substrate 101, which can also be called a base, can be made of Si.

The first insulating layer 102a and the second insulating layer 102b constitute the entire insulating layer, and the second insulating layer 102b covers the top of the substrate 101. Both the first insulating layer 102a and the second insulating layer 102b may be made of SiO2.

The first isolation layer 103a and the second isolation layer 104a constitute the entire isolation layer, the material of the first isolation layer 103a may be SiN, and the material of the second isolation layer 104a may be SiON.

Step 2, directly using the first photoresist 105a as a mask layer to etch perpendicular to the substrate to form the first trench 112a, as shown in FIG. 2a and FIG. 2b;

The first trench 112a may also be referred to as a bit line contact hole.

Figure 3A:
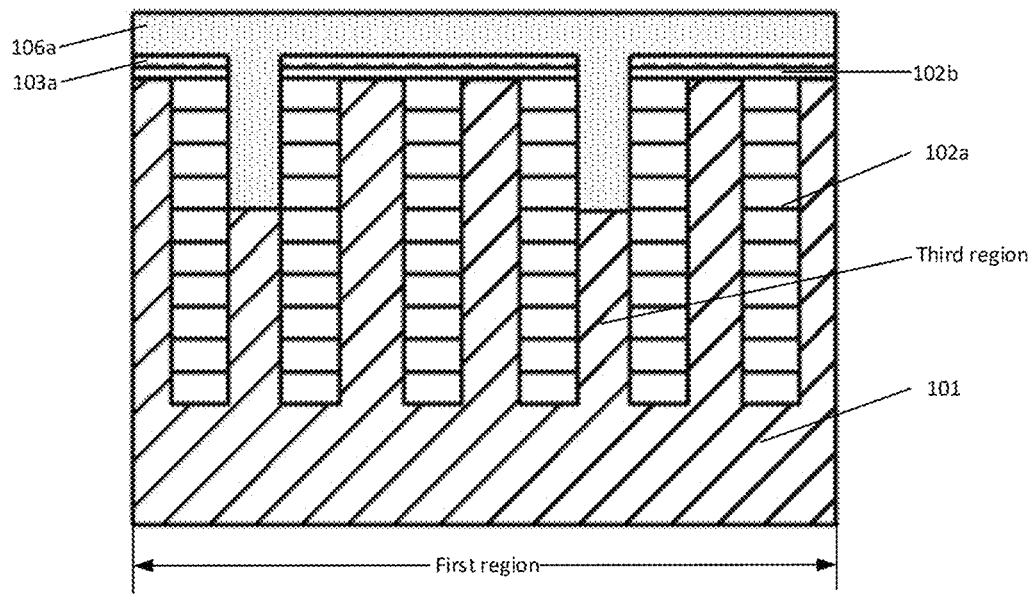
FIG. 3a and FIG. 3b are respectively the cross-sectional views of the first region and the second region of a structure obtained after backfilling polysilicon in the bit line contact hole in the fabrication process according to the embodiment of the present application.
Figure 3B:
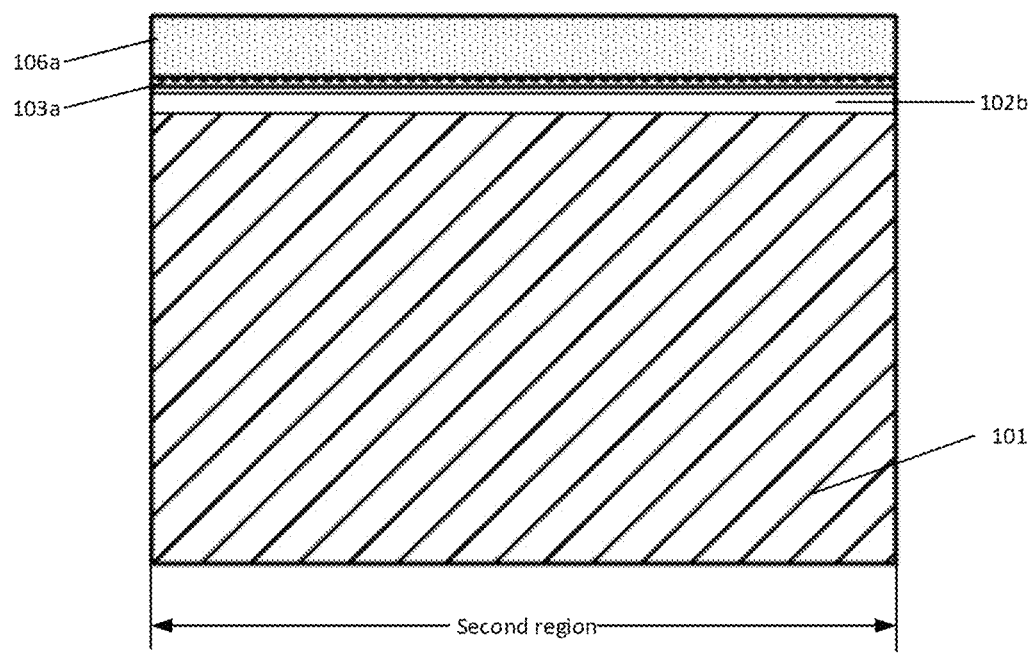
Figure 4A:
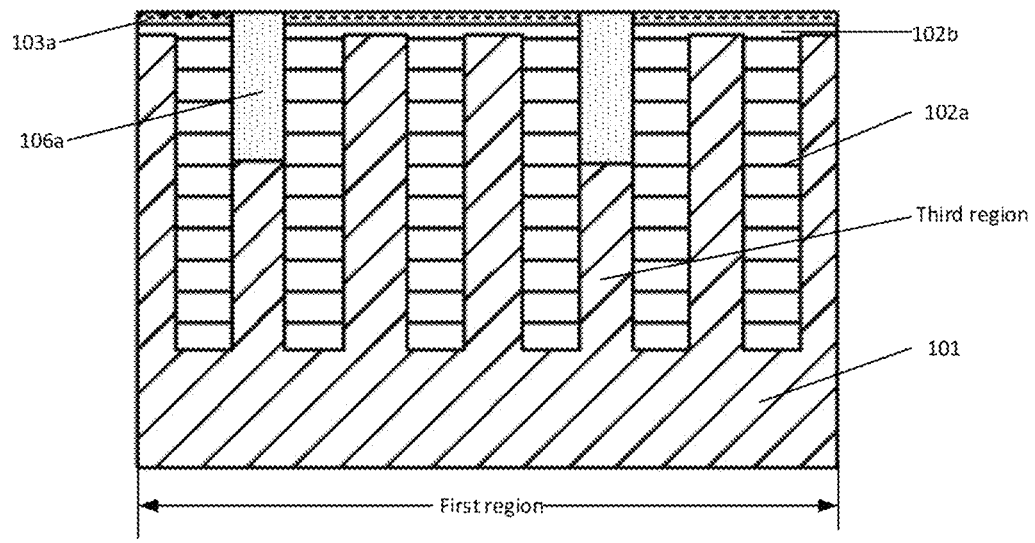
FIG. 4a and FIG. 4b respectively the cross-sectional views of the first region and the second region of a structure obtained after backfilling polysilicon in the bit line contact hole, and then directly etching back to the silicon nitride hole, and then directly etching back to the silicon nitride insulating layer, in the fabrication process according to the embodiment of the present application.
Figure 4B:
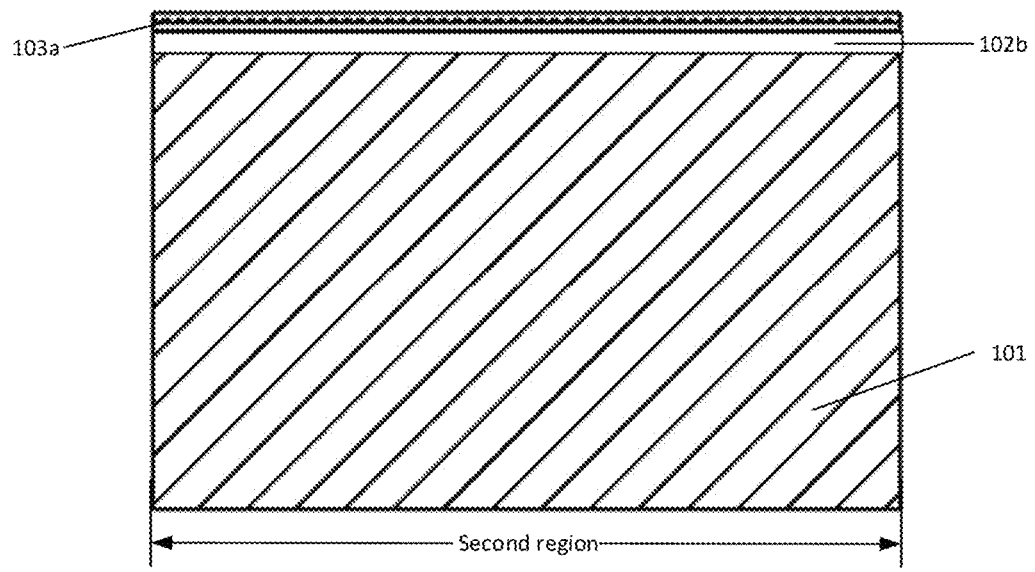
Figure 5A:
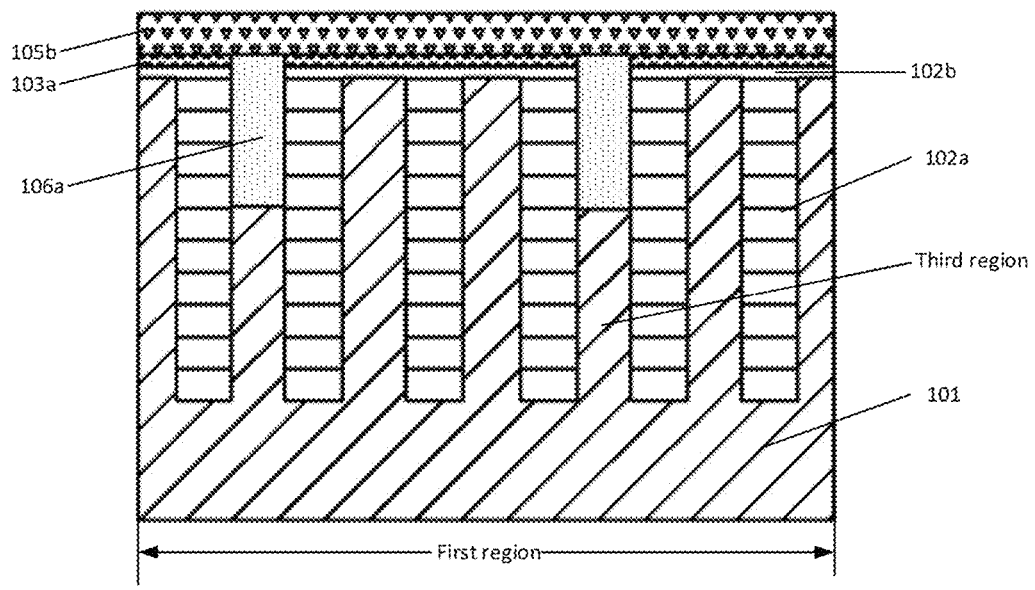
FIG. 5a and FIG. 5b are respectively the cross-sectional views of the first region and the second region of a structure obtained after a bit line contact hole is etched on the active region and the photoresist is covered in the array region in the fabrication process, according to the embodiment of the present application.
Figure 5B:
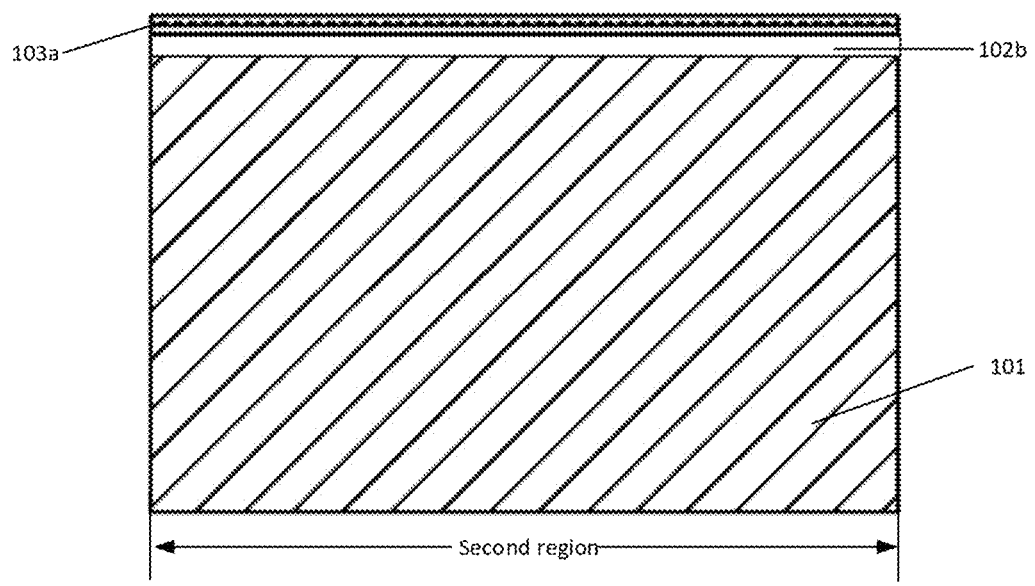
Figure 6A:
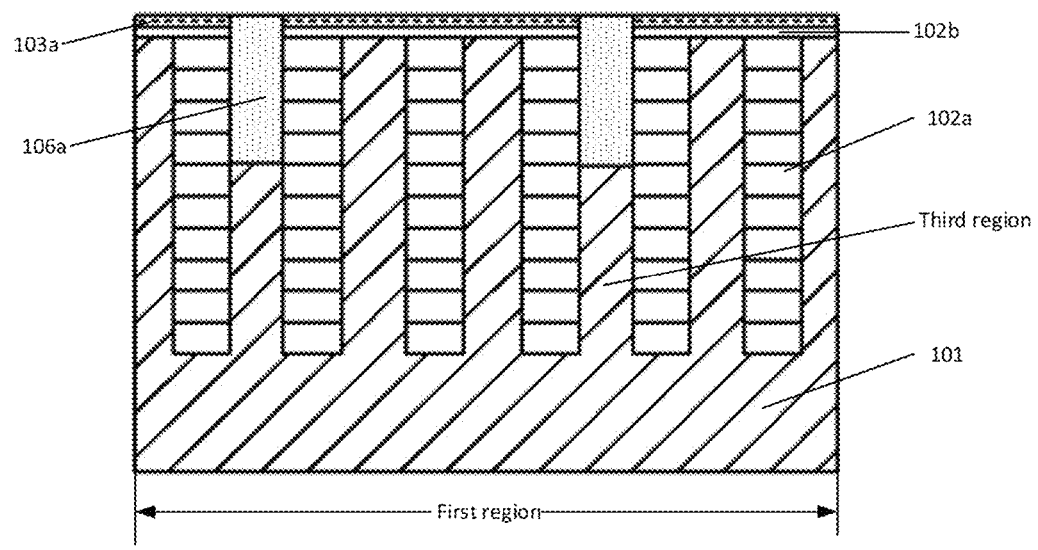
FIG. 6a and FIG. 6b are respectively the cross-sectional views of the first region and the second region of a structure obtained after removing the silicon nitride insulating layer in the peripheral circuit region in the fabrication process according to the embodiment of the present application.
Figure 6B:
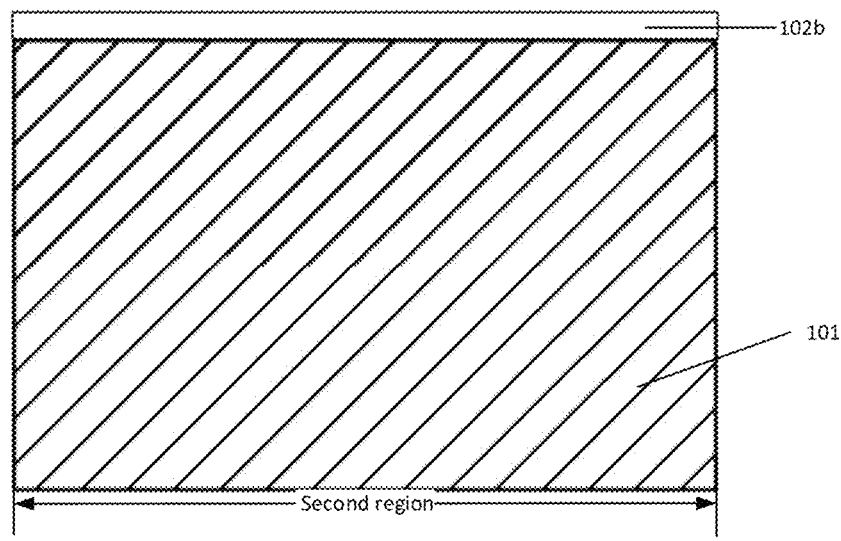
Figure 7A:
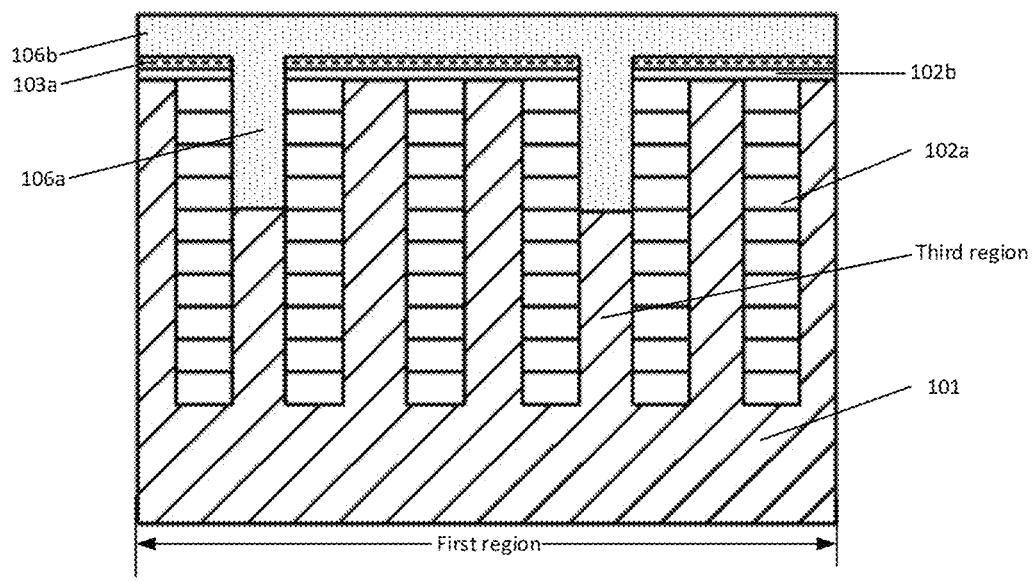
FIG. 7a and FIG. 7b are respectively the cross-sectional views of the first region and the second region of a structure obtained after the bit line contact hole is filled with a polysilicon layer in the fabrication process according to the embodiment of the present application.
Figure 7B:
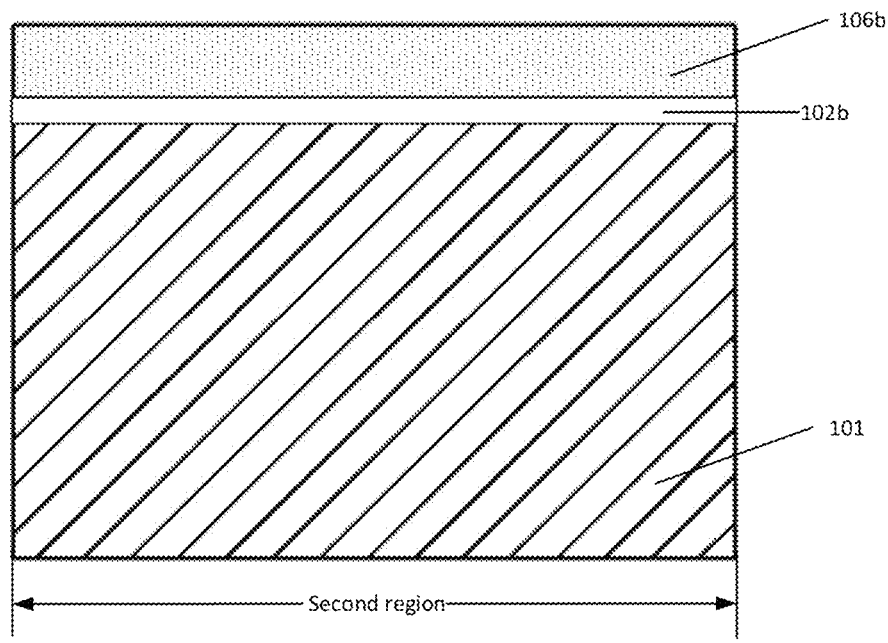
Figure 8A:
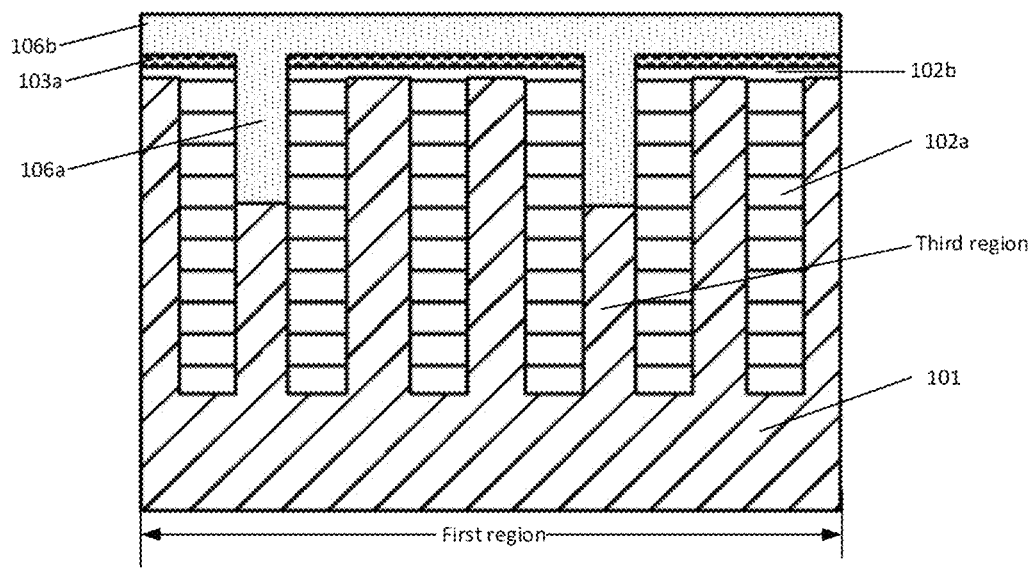
FIG. 8a and FIG. 8b are respectively the cross-sectional views of the first region and the second region of a structure obtained after the peripheral circuit region is covered with photoresist in the fabrication process according to the embodiment of the present application.
Figure 8B:
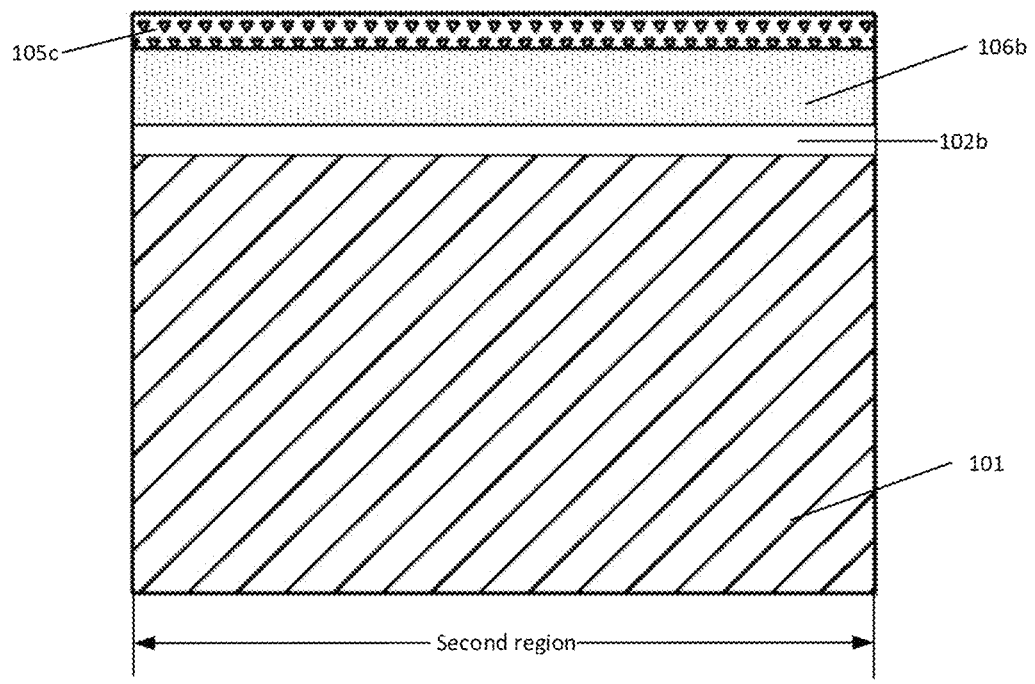
Figure 9A:
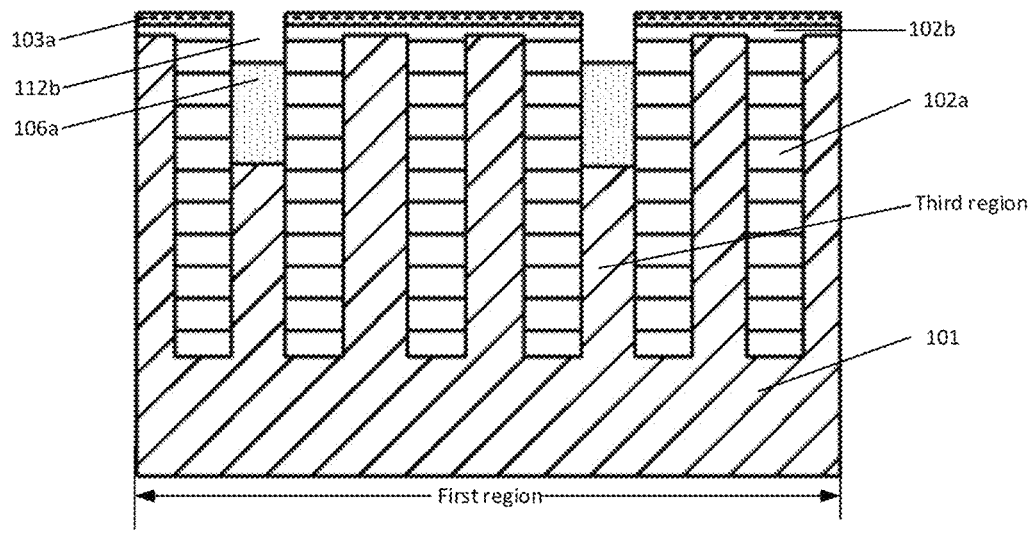
FIG. 9a and FIG. 9b are respectively the cross-sectional views of the first region and the second region of a structure obtained after back-etching the photoresist in the peripheral circuit area in the fabrication process according to the embodiment of the present application.
Figure 9B:
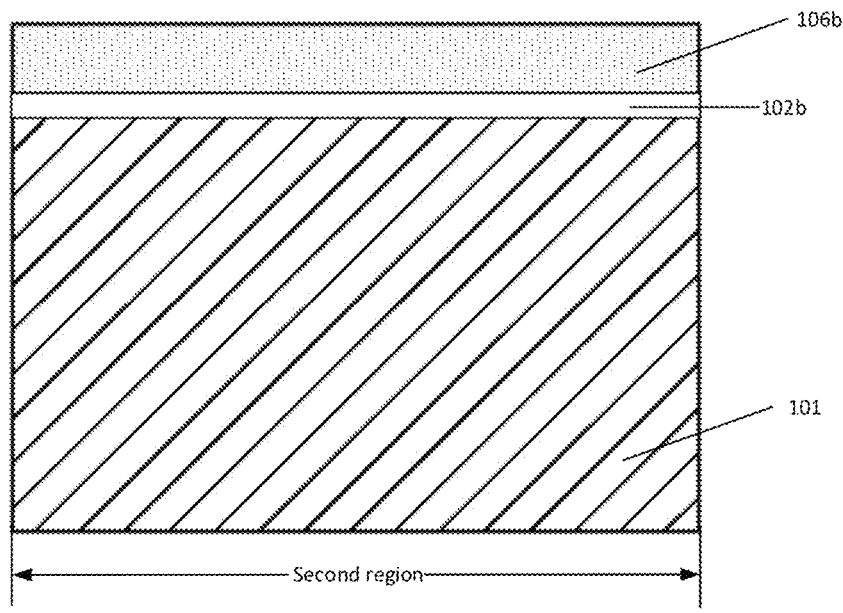

Step 3, as shown in FIGS. 3a and 3b, after backfilling the first polysilicon (POLY) layer 106a in the first trench 112a, directly etch back to the first isolation layer 103a, as shown in FIGS. 4a and 4b;

Step 4, after etching bit line contact holes (not shown in the figure) with a depth of, for example, 32-38 nm on the active region (i.e., the third region), cover the array area with a second photoresist 105b, as shown in FIG. 5a, as shown in FIG. 5b;

Step 5, removing the first isolation layer 103a in the peripheral circuit area, as shown in FIG. 6a and FIG. 6b;

Step 6, as shown in FIG. 7a and FIG. 7b, filling the second polysilicon layer 106b in the bit line contact hole;

Step 7, cover the third photoresist 105c in the peripheral circuit area, as shown in FIG. 8a and FIG. 8b, and then perform etching back to form the second trench 112b at the first trench 112a, as shown in FIG. 9a and FIG. 9b shown, and ensure that the second polysilicon layer 106b in the peripheral circuit region is not damaged.

The second trench 112b also belongs to the bit line contact hole.

The bit line contact holes described in the embodiments of the present application may also be referred to as bit line trenches, etc., that is, positions used to form bit lines.

The beneficial effects of the above-mentioned technological process provided by the embodiments of the present application are as follows:

1. The cost is reduced, the growth and removal process of the silicon oxide mask layer of the bit line contact hole is removed, and the process flow is saved;

2. The problem of inconsistent polysilicon heights of different bit line contact holes during the formation of the bit line contact holes is eliminated.

Figure 10:
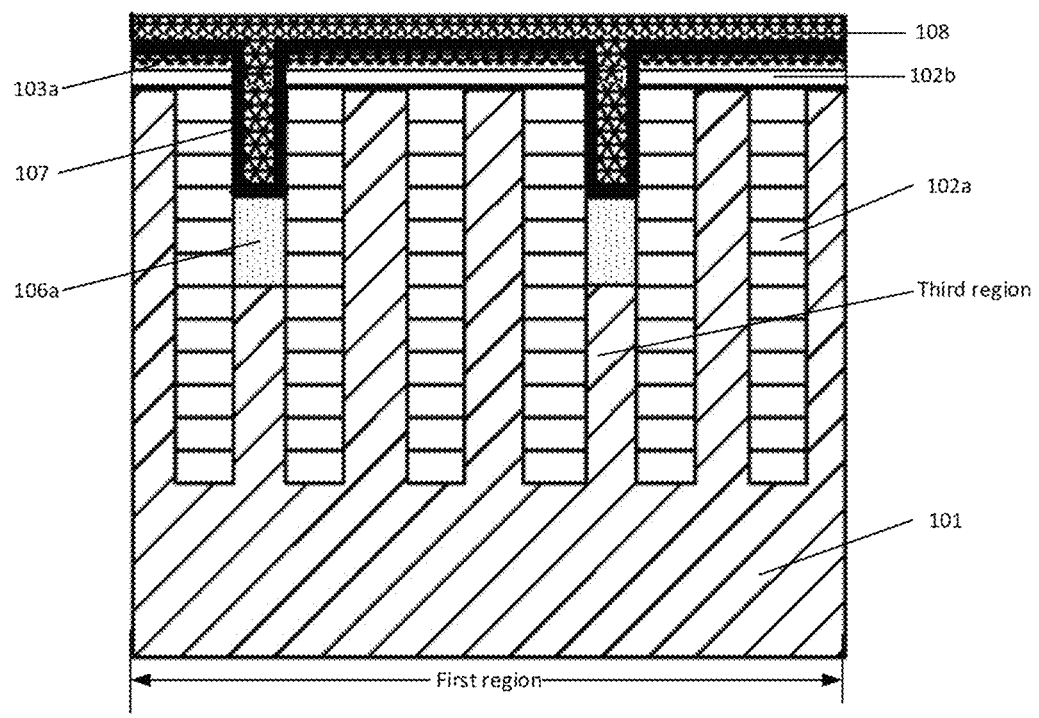
FIG. 10 shows a cross-sectional view of the first region of a structure obtained after filling the bit line contact hole, including first filling the titanium nitride layer and then filling the metal tungsten layer, so that half of the bit line is buried in the bit line contact hole, according to an embodiment of the present application.

Step 8, when filling the bit line contact hole, first fill the barrier layer 107, and then fill the bit line conductive layer 108, so that half of the bit line is buried in the bit line contact hole, as shown in FIG. 10; wherein, the barrier layer at least partially formed between the bit line conductive layer and the inner wall of the bit line trench. The function of the barrier layer is to prevent the metal from diffusing into the substrate and affect the performance of the substrate. The material of the barrier layer can be metal nitrides such as TiAlN, TaCN, TaSiN, TiN or TaN, and the thickness is between 100 angstroms and 200 angstroms. The material of the bit line conductive layer may include one or more of tungsten, titanium tungsten, and titanium nitride.

It should be noted that the above and subsequent "between" refers to a numerical range including two endpoints, for example, the above "between 100 angstroms and 200 angstroms" refers to including 100 and 200 angstroms. A numerical range for both endpoints.

Figure 11:
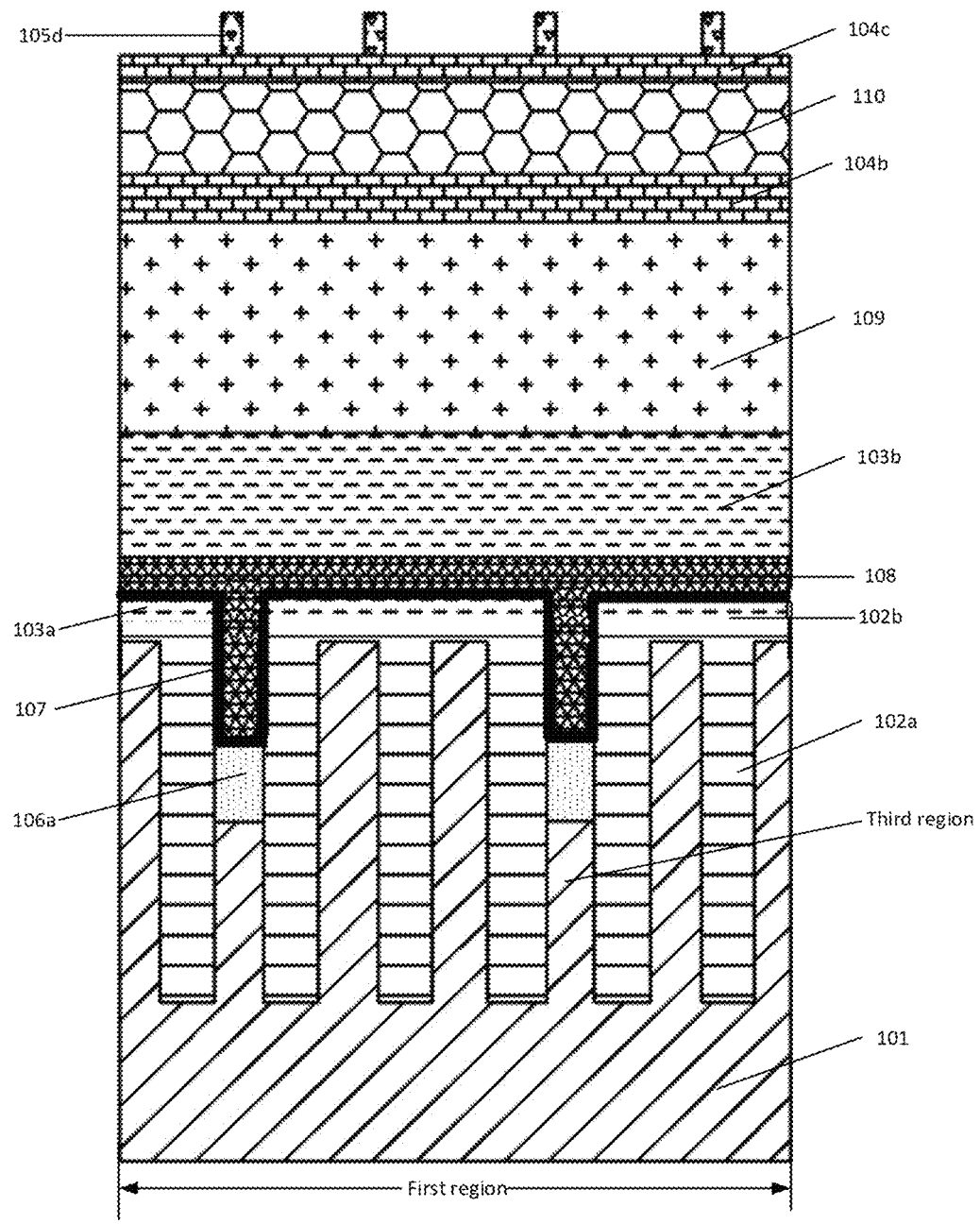
FIG. 11 is a cross-sectional view of the first region of a structure obtained after stacking materials required for forming bit lines in the fabrication process provided by an embodiment of the present application.

Step 9, the materials required to form the bit line are stacked, as shown in FIG. 11, including the third isolation layer 103b, the amorphous carbon layer (ACL) 109, the fourth isolation layer 104b, the spin coating hard mask (SOH) layer 110 and the fifth isolation layer 104c, wherein the material of the third isolation layer 103b may be SiN, and the material of the fourth isolation layer 104b and the fifth isolation layer 104c may be SiON.

Figure 12:
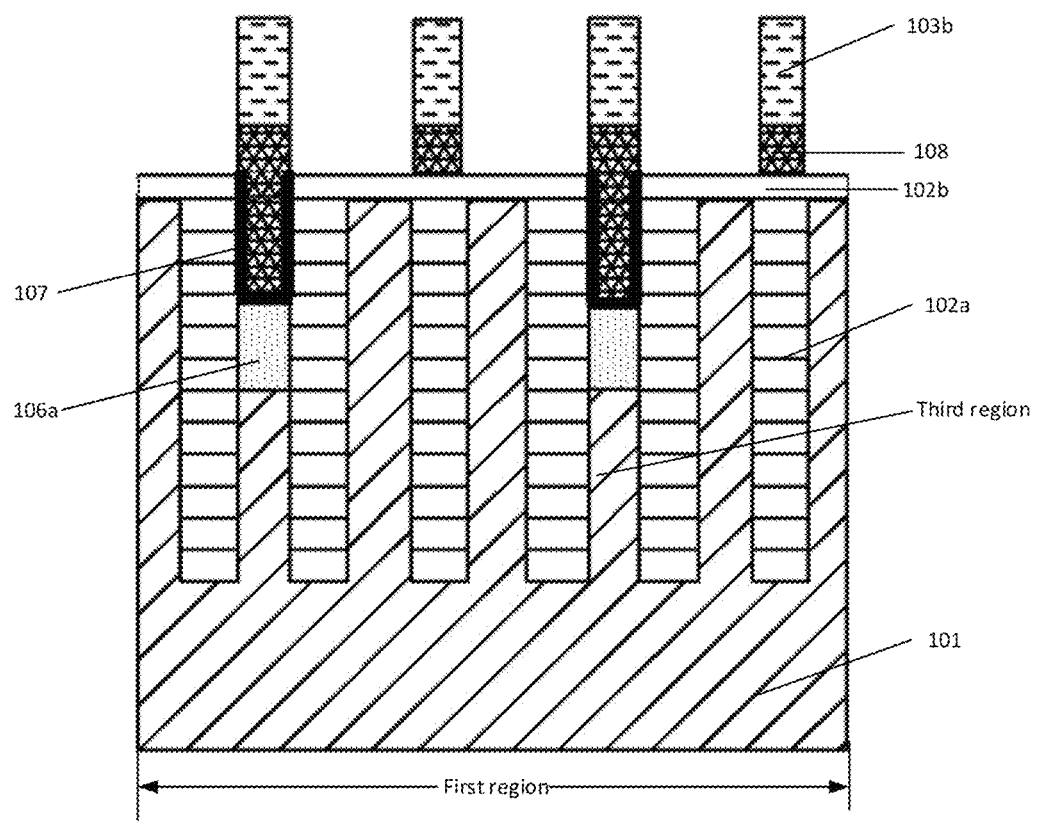
FIG. 12 is a cross-sectional view of the first region of a structure obtained after required bit lines are formed by patterning processes such as photolithography and etching in the semiconductor structure fabrication process provided by the embodiment of the application.

Step 10, form the required bit line conductive layer 108 through patterning processes such as photolithography and etching, and cover the top of the bit line conductive layer 108 with a third isolation layer 103b, as shown in FIG. 12.

Figure 13:
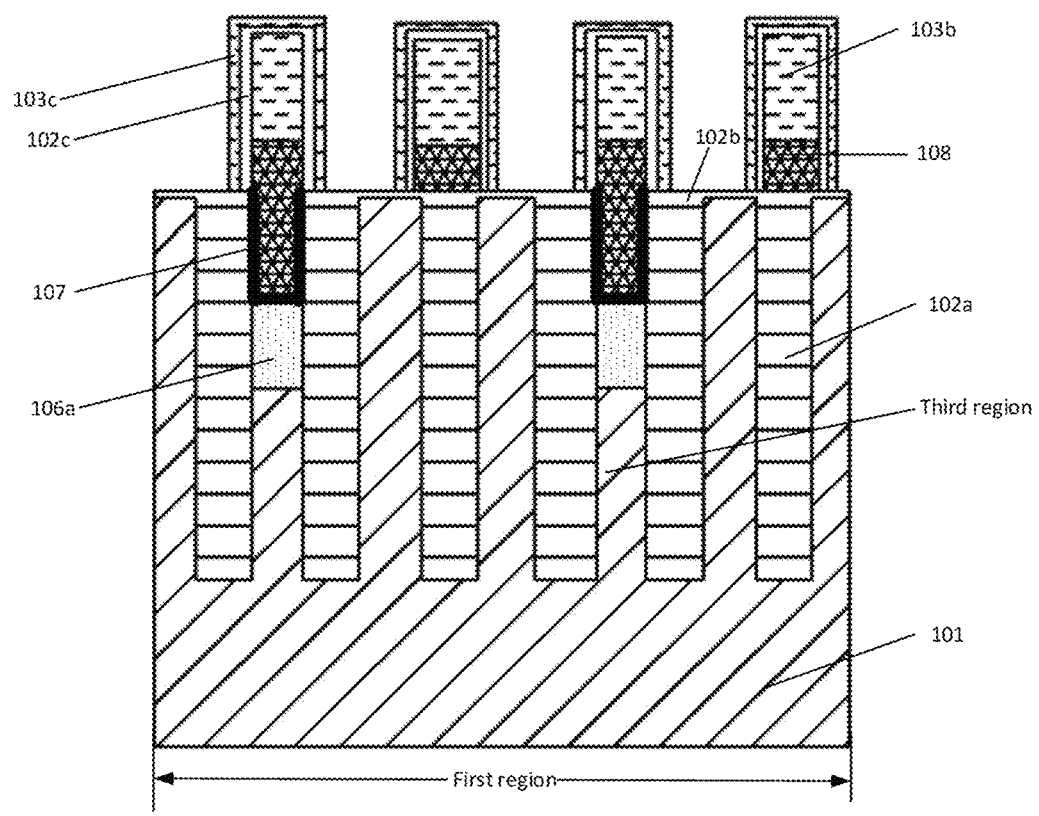
FIG. 13 is a cross-sectional view of the first region of a structure obtained after covering the surface of the bit line with silicon oxide and silicon nitride and forming a sidewall deposition insulating layer protection in the fabrication process provided by the embodiment of the present application.

Step 11, as shown in FIG. 13, cover the surface of the bit line conductive layer 108 and the third isolation layer 103b higher than the substrate in sequence with the third insulating layer 102c and the sixth isolation layer 103c to form the sidewall deposition insulating layer protection; The material of the third insulating layer 102c may be silicon oxide (SiO2), and the material of the sixth isolation layer 103c may be silicon nitride (SiN).

In addition, in this embodiment, the third insulating layer 102c and the sixth isolation layer 103c are formed, but only one of them may be formed.

Figure 14:
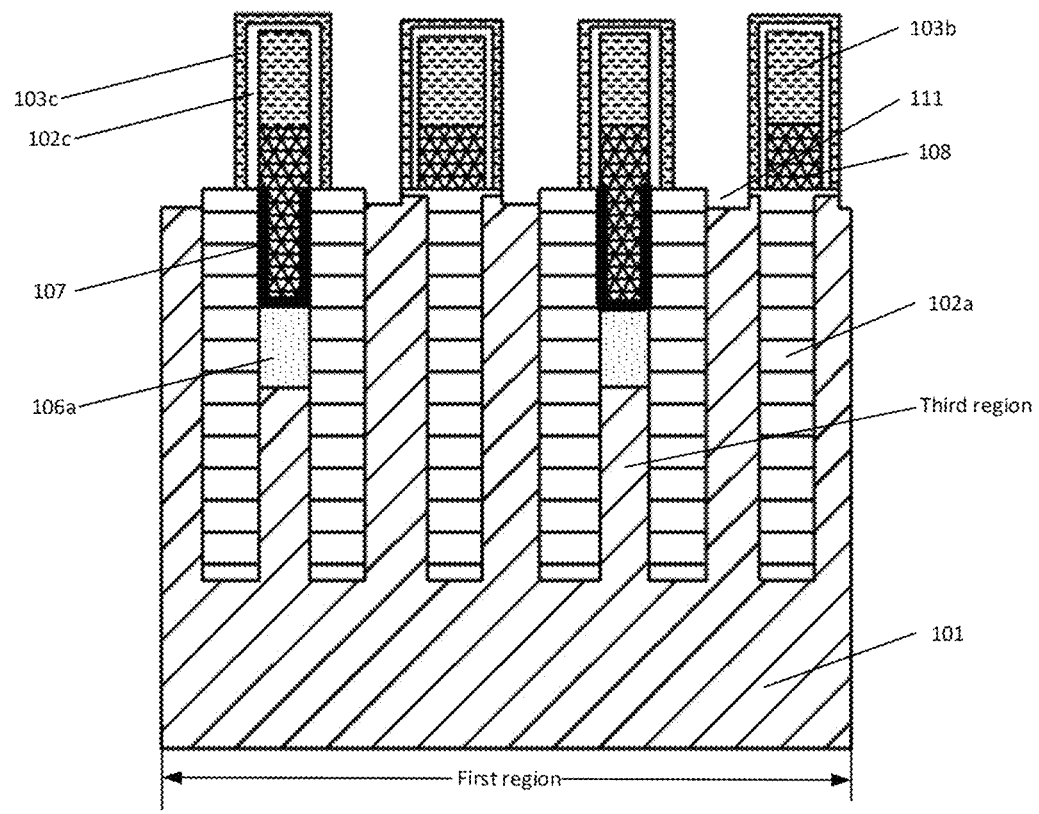
FIG. 14 is a cross-sectional view of the first region of a structure obtained after the oxide layer on the surface of the node contact hole is opened by dry etching in the fabrication process provided by the embodiment of the application.

Step 12, open the oxide layer (SiO2) on the surface of the node contact hole 111 through dry etching, that is, remove the second insulating layer 102b on the surface of the substrate, as shown in FIGS. 13 and 14; wherein, the node contact hole 111, that is, the space between the adjacent bit line conductive layers 108 (formed in the eleventh step) covered with the sixth isolation layer 103c.

Figure 15:
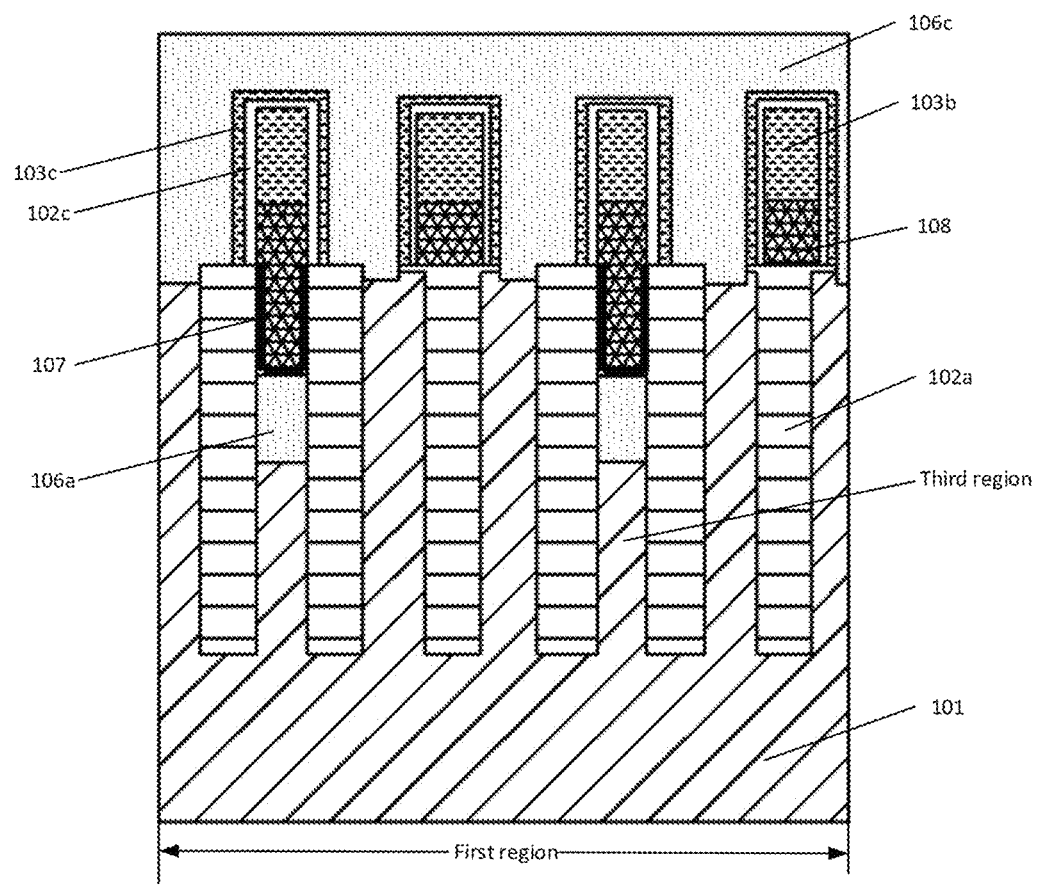
FIG. 15 is a cross-sectional view of the first region of a structure obtained after backfilling polysilicon and connecting the active region and the top device to form a connecting circuit in the fabrication process provided by the embodiment of the application.

Step 13, as shown in FIG. 15, backfill the third polysilicon layer 106c in the node contact hole 111, the third polysilicon layer 106c is in contact with the substrate 101, and the active area is connected with the top device to form a connecting circuit;

As can be seen from FIG. 15, in the embodiment of the present application, since the bit line is half-buried, the height of the isolation layer 103 b at the bit line is reduced, and the third most of the contact hole 111 between the subsequent bit line 108 and the bit line 108 is the third highest. The filling effect of the crystalline silicon layer 106c is improved, and the generation of voids or voids is avoided.

The first polysilicon layer 106a described in the embodiments of the present application is also the first contact layer.

The third polysilicon layer 106c described in the embodiments of the present application is the second contact layer, and the second contact layer is used to connect the active region and the top device to form a communication circuit.

The beneficial effects of the above-mentioned technological process provided by the embodiments of the present application are as follows:
1. Half of the bit line is buried in the bit line contact hole, which reduces the height of the bit line and improves the stability of the bit line structure; and
2. The height of silicon nitride at the bit line is reduced, which reduces the probability of voids generated during the filling process of polysilicon at the node contact hole, and improves the filling effect.

To sum up, referring to the above drawings in sequence, a semiconductor structure provided by the embodiments of the present application is formed in the bit line trench 112b in the substrate 101, and the semiconductor structure includes:

A bit line conductive layer 108 is formed in the bit line trench, and the top surface of the bit line conductive layer 108 is higher than the surface of the substrate 101;

A barrier layer 107 is formed at least partially between the bit line conductive layer 108 and the inner wall of the bit line trench;

The isolation layer (which may include one or more layers, such as the first isolation layer 103a, the second isolation layer 104a, the third isolation layer 103b, the fourth isolation layer 104b, the fifth isolation layer 104c, the sixth isolation layer 103c), is formed on top of the bit line conductive layer.

In one embodiment, a first contact layer 106a is disposed at the bottom of the barrier layer.

In one embodiment, the semiconductor structure further includes:

the second contact layer 106c covers the isolation layer, and the bottom of the second contact layer 106c is connected to the substrate 101.

In one embodiment, the semiconductor structure further includes:

the insulating layer (which may include one or more layers, such as the first insulating layer 102a, the second insulating layer 102b, a third insulating layer 102c) and/or another isolation layer.

Figure 16:
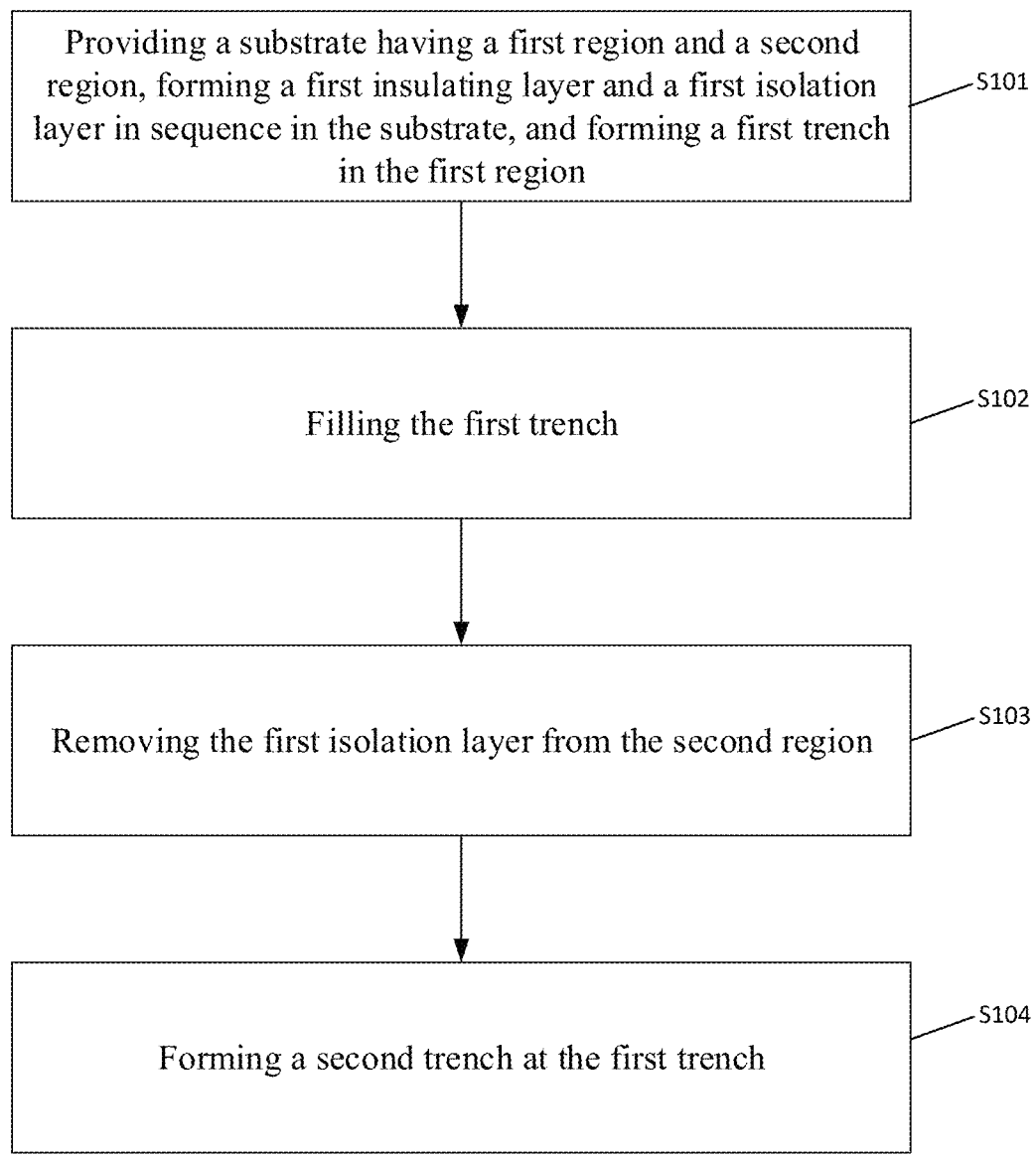
FIG. 16 is the schematic flowchart of the method for forming the semiconductor structure according to an embodiment of the present application.

Referring to FIG. 16 and other above-mentioned drawings, the method for forming a semiconductor structure according to one embodiment of the present application includes:

S101, providing a substrate 101 having a first region and a second region, providing the substrate 101 with a first insulating layer 102a and a first isolation layer 103a in sequence, and forming a first trench 112a in the first region;

S102, filling the first trench 112a;

S103, removing the first isolation layer 103a from the second region; and

S104, forming a second trench 112b at the first trench 112a.

In one embodiment, the first trench 112a is formed by the following step:

covering the second isolation layer 104a on the first isolation layer 103a in the first region and the second region;

covering the first photoresist 105a on the second isolation layer 104a in the first region and the second region, and exposing the first photoresist 105a in the first region to form a desired pattern; and using the first photoresist 105a as a mask layer, to etch perpendicular to the substrate to form the first trench 112a.

In one embodiment, the filling of the first trench 112a specifically includes:

backfilling the first polysilicon layer 106a in the first trench 112a, and etching back the first polysilicon layer 106a to the first isolation layer 103a.

In one embodiment, before removing the isolation layer of the second region, it further comprises:

after etching the bit line contact hole 111 at a predetermined depth on the third region, covering the first region with the second photoresist 105b.

In one embodiment, forming the second trench 112b at the first trench 112a specifically includes:

filling the second polysilicon layer 106b in the bit line contact hole 111;

covering the second region with the third photoresist 105d, and performing etch back, so that the second trench 112b is formed at the first trench 112a, and the second polysilicon layer 106b located in the second region is not damaged.

In one embodiment, after forming the second trench 112b, the method further includes:

forming a bit line at the second trench 112b.

In one embodiment, forming the bit line at the second trench specifically includes: filling the second trench 112b;

stacking the materials used to form the bit lines;

forming the required bit line conductive layer 108 by photolithography and etching on the material, and forming a third isolation layer 103b on the top of the bit line conductive layer 108.

In one embodiment, filling the second trench 112b specifically includes:

first filling the barrier layer 107, then filling the bit line conductive layer 108, wherein the barrier layer 107 is at least partially formed between the bit line conductive layer 108 and the inner wall of the second trench 112b.

In one embodiment, after forming the bit line, the method further includes:

forming the second contact layer 106c to overlay the third isolation layer 103b and the substrate 101.

In one embodiment, forming the second contact layer 106c specifically includes:

forming a third insulating layer 102c and/or a sixth isolation layer 103c on the top surface and the sidewalls of the third isolation layer 103b, and also on the portion of the sidewalls of the bit line conductive layer 108 which is higher than the top surface of the substrate 101;

removing by dry etch the second insulating layer 102b from the top surface of the substrate 101 to form a node contact hole 111;

backfilling the third polysilicon layer 106c in the node contact hole 111 to form a second contact layer.

Obviously, those skilled in the art can make various changes and modifications without departing from the spirit and scope of the present application. Thus, if these modifications and variations of the present application fall within the scope of the claims of the present application and their equivalents, the present application is also intended to include these modifications and variations.

The invention claimed is:

1. A method for forming a semiconductor structure, comprising:

providing a substrate having a first region and a second region, forming a first insulating layer and a first isolation layer in sequence in the substrate, and forming a first trench in the first region;

filling the first trench;

removing the first isolation layer from the second region; and forming a second trench at the first trench;

wherein before removing the isolation layer from the second region, further comprising:

covering the first region with a second photoresist after etching bit line contact holes with a predetermined depth in a third region;

wherein forming a second trench at the first trench comprises:

filling the bit line contact hole with a second polysilicon layer;

covering the second region with a third photoresist, and performing etchback to form the second trench at the first trench, wherein the second polysilicon layer located in the second region is not damaged.

2. The method according to claim 1, further comprising:

forming the first trench by following steps:

covering on the first isolation layer with a second isolation layer in the first region and the second region;

covering on the second isolation layer with a first photoresist in the first region and the second region, and exposing the first photoresist to form desired patterns in the first region; and using the first photoresist as a mask layer to etch perpendicular to the substrate to form the first trench.

3. The method of claim 2, wherein filling of the first trench specifically comprises:

backfilling a first polysilicon layer in the first trench, and etching back the first polysilicon to the first isolation layer.

4. The method of claim 1, after forming the second trench, the method further comprising:

forming a bit line at the second trench.

5. The method of claim 4, wherein forming the bit line at the second trench comprises:

filling the second trench;

stacking materials used in the method to form the bit line;

forming a bit line conductive layer on the materials through photolithography and etching; and forming a third isolation layer on a top of the bit line conductive layer.

6. The method of claim 5, wherein filling the second trench further comprises:

first filling a barrier layer, then filling the bit line conductive layer, wherein the barrier layer is at least partially formed between the bit line conductive layer and an inner wall of the second trench.

7. The method of claim 4, wherein after forming the bit line, the method further comprises:

forming a second contact layer to overlay the third isolation layer and the substrate.

8. The method of claim 7, wherein forming the second contact layer further comprises:

forming a third insulating layer and/or a sixth isolation layer on a top surface and sidewalls of the third isolation layer, and also on a portion of sidewalls of the bit line conductive layer which is higher than a top surface of the substrate;

removed the second insulating layer by dry etch from the top surface of the substrate to form a node contact hole; and backfilling a third polysilicon layer in the node contact hole to form a second contact layer.

* * * * *